FREQUENCY SYNTHESIZER HAVING A VERY HIGH SPECTRAL PURITY

This application is a continuation-in-part of application Ser. No. 913,726 filed June 7, 1978.

BACKGROUND OF THE INVENTION

In some fields of application, frequency synthesizers are not known for quality of their spectrum, especially as regards the spectral noise components situated more than a few kHz from the carrier.

Because of this, they are barred from a certain number of applications, such as measurement of the signal/-noise ratio on receivers, the control of UHF transmitters and the use of the synthesizer as a local oscillator for a spectrum analyser with a high dynamic characteristic.

It would be desirable, for such applications, to be able to make a synthesizer covering a range of high frequencies going up to several hundder MHz with a noise level, at 12.5 kHz from the carrier, equal to $-140$ db/Hz at the most.

Now the synthesis of high frequencies is generally effected by comparison of the frequency of an harmonic component having a standard frequency of the order of 10 MHz with the output frequency of a voltage-controlled oscillator (VCO), and by tuning the latter. While it is known how to make a crystal master oscillator which generates the standard frequency with the desired spectral purity, multiplication of this standard frequency by factors of several tens multiplies the noise in the same ratio and makes it quite incompatible with the application envisaged.

SUMMARY OF THE INVENTION

The present invention solves this problem by means of a synthesizing device mainly characterized in that it uses the multiplication of the standard frequency by a factor equal to ten at the most; the mixing, in a sampler, of the beat obtained between the output frequency of the oscillator and the harmonic component of the standard frequency resulting from said multiplication, with a frequency obtained by dividing said standard frequency by a whole number lower than 10.

According to a preferred form of embodiment, the standard frequency is taken equal to 80 MHz and the division factor is taken equal to 8.

Under these conditions, the device will cover an octave starting from a frequency of the order of 300 MHz, with standard frequency multiplication factors not exceeding 7 or 8, and, consequently, not leading to any considerable multiplication of the master oscillator's own noise, and the sampler will operate on an harmonic component equal in rank to 5 at most of the frequency of 10 MHz resulting from the division, therefore it will not introduce any considerable noise.

Such a synthesizing circuit makes it possible to vary the output frequency in steps of 10 MHz.

According to an important feature of the invention, when, on basis of such a circuit, it is wished to obtain a generator which can be frequency-modulated, a synthesizing circuit in 1 kHz steps made in accordance with U.S. Pat. No. 4,186,356 filed on Apr. 18th, 1978 in the name of Joël Remy for "Phase locked loop frequency synthesizer and frequency modulator", is associated with the synthesizing circuit in 10 MHz steps defined above.

Such a circuit includes a main frequency-modulated oscillator and a voltage-controlled auxiliary oscillator, each controlled by a phase-locking loop and is characterized in that the control loop of each of these two oscillators has its origin at the output of the other oscillator (such a circuit arrangement will be termed an "overlapping loop circuit"). The mixer of the loop which controls the auxiliary oscillator receives an intermediate frequency.

It constitutes the only known way of obtaining a frequency-modulated synthesizer having high resolution and in which the noise which affects the auxiliary oscillator and the intermediate frequency is filtered by the pass-band of the main oscillator's control loop.

By virtue of the peculiarities listed above, taken together, the invention makes it possible to obtain a frequency synthesizer having, in addition to the advantages inherent in any synthesizer (high stability, programming possibility) a spectral purity comparable to that of generators which use a pot oscillator with very high Q factor.

DESCRIPTION OF THE DRAWINGS

A better understanding of the invention will be obtained from the following description.

In the attached drawings:

FIG. 1 shows a preferred form of embodiment of a synthesizing circuit in 1 kHz steps associated with an interpolation circuit;

FIG. 5 shows a preferred embodiment of part C of block 352 illustrated in FIG. 3.

DESCRIPTION OF THE PREFERRED EMBODIMENT

Figure 3:
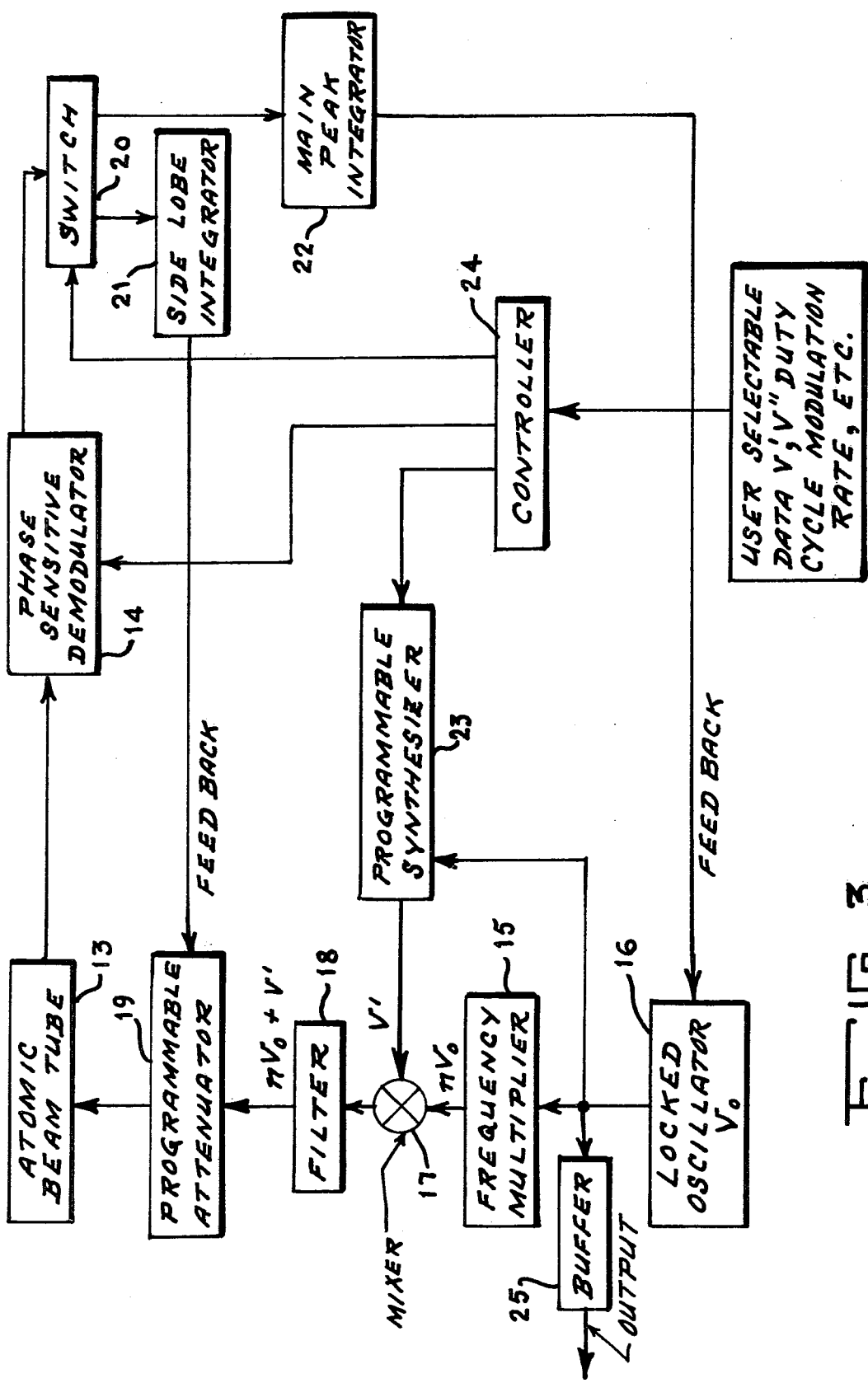
FIG. 3 shows a preferred form of embodiment of a synthesizing circuit in 10 MHz steps, a circuit inserting the 1 kHz steps and a circuit defining the output subranges of a synthesizing circuit.

The synthesizing circuit illustrated in FIGS. 1 and 3 taken together is designed to cover the range from 300 kHz to 640 MHz in steps of 1 kHz, with frequency modulation (including transmission of the D.C. component) and amplitude modulation functions.

FIG. 1 shows, inside a rectangle 1, a synthesizing device with a frequency comprised between 20 and 30 MHz in steps of 1 kHz. This device is of the type described in the above-mentioned copending patent application.

It includes a voltage-controlled oscillator 2 covering the range from 20 to 30 MHz, followed by a mixer 3. The latter is moreover driven by a voltage-controlled oscillator 4 covering the range from 10 to 26 MHz, itself followed by a programmable divider 5 whose division factor D may vary between 16,000 and 26,000. This divider drives a mixer 6, moreover driven by a standard frequency of 1 kHz supplied by a source 7. The output from mixer 6 controls the frequency of oscillator 2. The output from mixer 3, after passing through a pass-band filter 8 which only allows the subtractive beat to pass between the frequencies of oscillators 2 and 4, i.e. 4 MHz$\pm\Sigma$, $\Sigma$ being a small frequency value, drives a mixer 9, which moreover receives, at its terminal 91, a frequency of 4 MHz$\pm\Delta$, $\Delta$ being a frequency variation

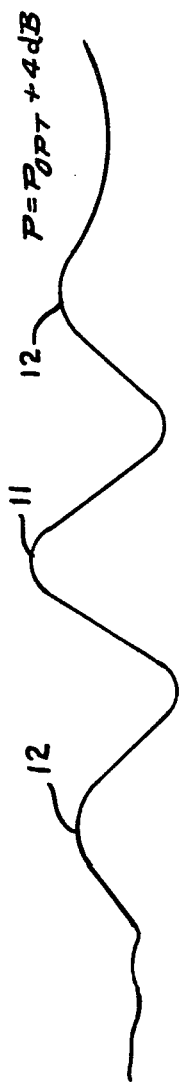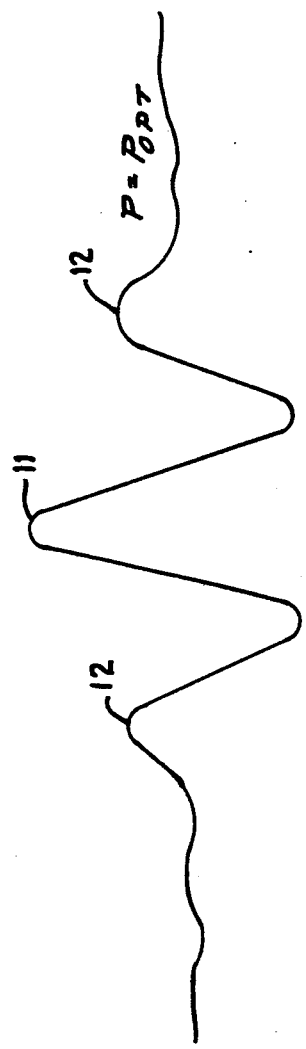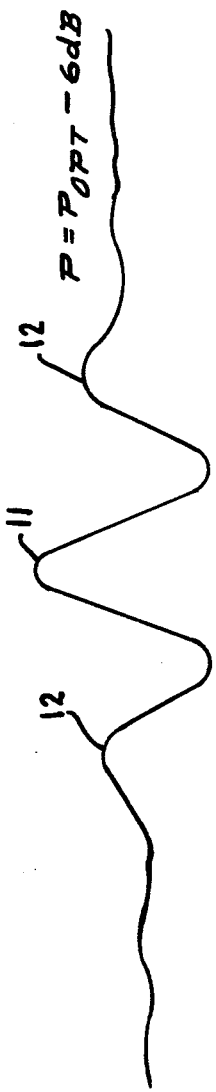

MICROWAVE POWER LEVEL STABILIZING CIRCUIT FOR CESIUM BEAM FREQUENCY STANDARDS

STATEMENT OF GOVERNMENT INTEREST

The invention described herein may be manufactured and used by or for the Government for governmental purposes without the payment of any royalty thereon.

This is a continuation-in-part of co-pending patent Application Ser. No. 926,059 entitled MIROWAVE POWER LEVEL STABILIZATING CIRCUIT FOR CESIUM BEAM FREQUENCY STANDARDS filed by David W. Allan et al, July 19, 1978, now abandoned.

BACKGROUND OF THE INVENTION

This invention relates to atomic clocks and in particular to cesium beam frequency standards and to means for eliminating microwave power fluctuation induced frequency errors in such devices.

An atomic clock is an electronic clock whose frequency is supplied or governed by the natural resonance frequencies of atoms or molecules of suitable substances. It is the most precise of all clocks. U.S. Pat. No. 3,076,942 entitled *Molecular Beam Frequency Standard* issued to J. H. Holloway et al, Feb. 5, 1963 as well as other publications describe these devices in detail. They are commonly used in navigation systems such as Loran C; deep space communications and Doppler navigation; and collision avoidance systems for aircraft. All of these and other applications require extremely precise time measurements. It has been observed, however, that frequency drift of the order of several parts in $10^{13}$ per year commonly occur in some atomic clocks such as the commercial cesium beam frequency standard. Accordingly, there is an important need to obtain clocks with better long term stability than is now available. Such a need is evidenced by the Department of Defense's Global Positioning System, a multi-billion dollar navigation system to be in operation in the next decade.

Dispersion between various national time scales, such as USNO and NBS is also significantly affected by long-term instabilities in cesium beam frequency standards. A significant cost savings can be achieved as a result of the present invention due to a much less frequent need to carry portable clocks as it is now needed for synchronization of Loran C and Omega navigation systems, and of various satellite tracking stations. Heretofore, a minimum of two portable atomic clock trips has been necessary to transfer frequency with the necessary accuracy. It is anticipated that improvements in atomic clocks provided by the present invention will provide accurate frequency transfer from only one trip; a very important consideration for remote tracking sites. Such improvements reduce the environmental sensitivity of atomic beam frequency standards thereby improving significantly the stability of a portable clock subject to environmental fluctuations far in excess of ideal laboratory conditions.

The present invention is also directed toward allowing a reduction in the degree of environmental stability required for laboratory clock ensembles, such as NBS and USNO, for example.

SUMMARY OF THE INVENTION

The invention is directed to a microwave power control servo system for an atomic beam frequency standard. The microwave power level of a Ramsey type microwave cavity employed in a cesium beam frequency standard is stabilized in order to eliminate frequency error in the perceived atomic resonance. The invention comprehends a servo that controls the microwave power by constraining the sidelobe of the atomic beam spectrum to a fixed offset frequency with respect to the central peak. The servo comprises a time shared demodulator and frequency comparator for alternate interrogation of the central atomic peak and a sidelobe of the atomic frequency spectrum produced by the cesium beam tube. The central peak frequency is used as a reference to control a locked oscillator and provide a working frequency reference which is supplied to a frequency multiplier and modulator. Frequency shifts in the sidelobe indicate a shift in a microwave power level and are used to make power level corrections to eliminate for changes in the frequency of the central peak.

It is a principle object of the invention to provide a new and improved atomic clock.

It is another object of the invention to provide a method for effecting microwave power level stability in a cesium beam frequency standard.

It is another object of the invention to provide means for reducing the environmental sensitivity of an atomic beam frequency standard.

It is another object of the invention to provide a cesium beam frequency standard having better long term frequency stability than can be achieved with currently available atomic clocks.

These together with other objects, features and advantages of the invention will become more readily apparent from the following detailed description when taken in conjunction with the accompanying drawings.

DESCRIPTION OF THE DRAWINGS

Figure 2:
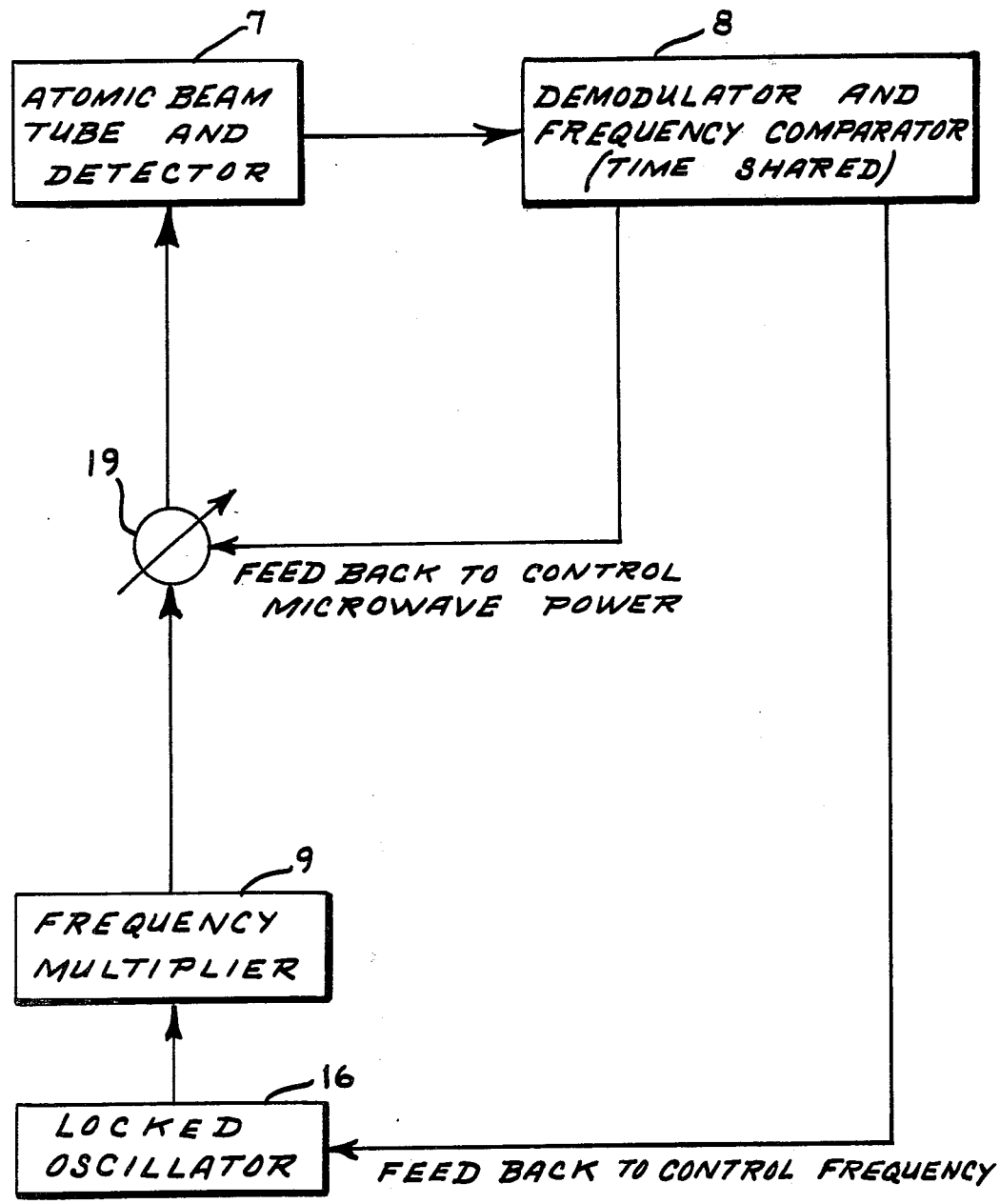
FIG. 2 shows a preferred variant of the main oscillator circuit comprised in the circuit of FIG. 1.

FIG. 1a illustrates the atomic frequency spectrum of an atomic clock whose microwave power exceeds its optimum level;

FIG. 1b illustrates the atomic frequency spectrum of an atomic clock having an optimum microwave power level;

FIG. 1c illustrates the atomic frequency spectrum of an atomic clock whose microwave power is less than its optimum level;

FIG. 2 is a generalized block diagram of an atomic clock incorporating the microwave power level control circuit of the invention;

FIG. 3 is a detailed block diagram of the servo system of the invention; and

Figure 4:
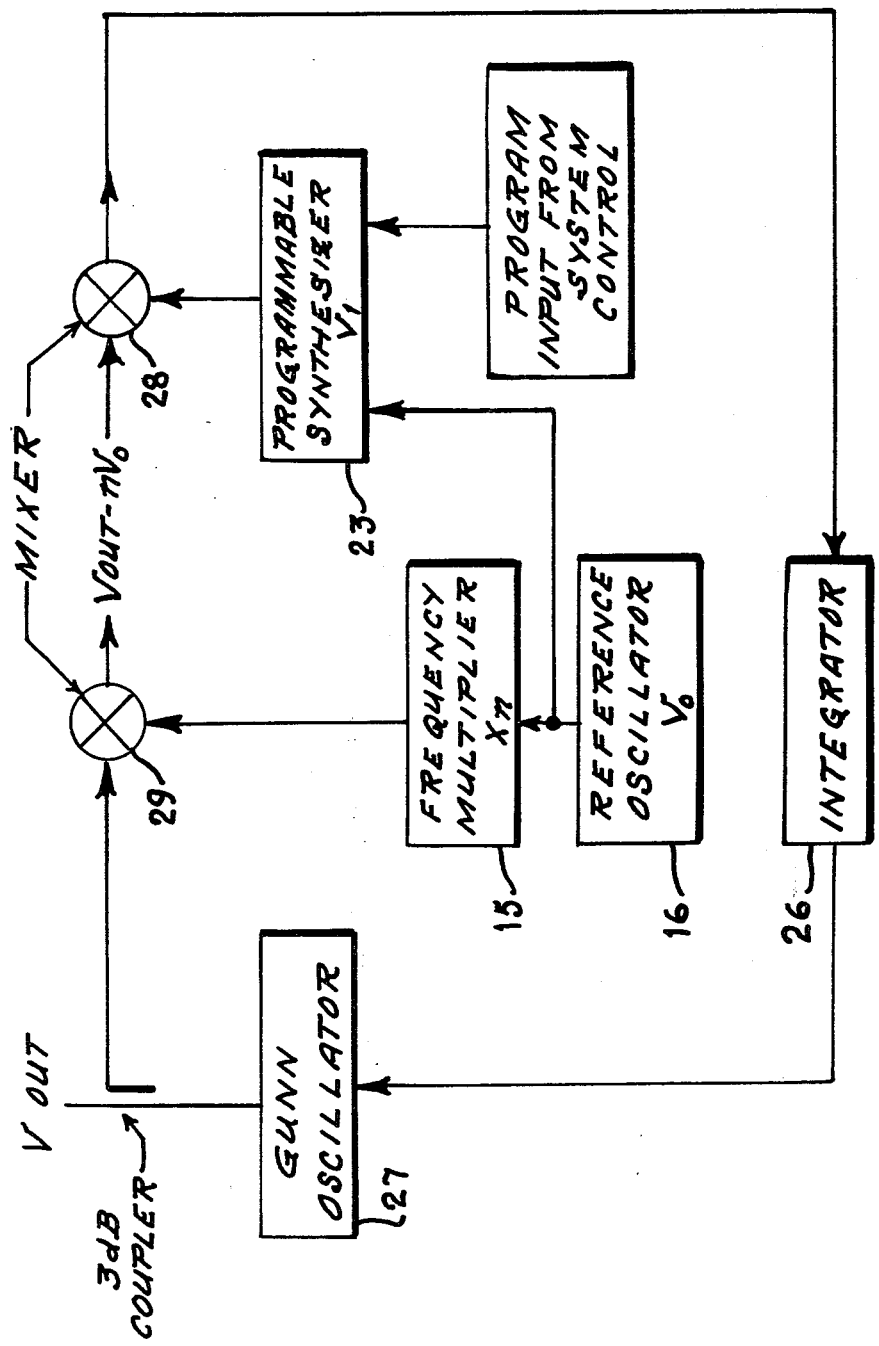
FIG. 4 shows a preferred embodiment of part B of block 352 illustrated in FIG. 3.

FIG. 4 is a block diagram showing phase lock of the system Gunn oscillator to $n\nu_o + \nu'$.

DETAILED DESCRIPTION OF THE PREFERRED EMBODIMENT

A cesium beam frequency standard of the type that can be adapted to the present invention is described in detail in the publication entitled *Recent Progress on the NBS Primary Frequency Standard* by D. J. Glaze et al, Proceedings of the 27th Annual Symposium on Frequency Control, Atlantic City, N.J., 1973. The publication entitled *Some Causes and Cures of Frequency Instabilities In Cesium Beam Frequency Standards* by David W. Allan et al, Proceedings of the 31st Annual Symposium on Frequency Control, Atlantic City, N.J., 1977 describes research conjoint with the subject matter and conception of the invention.

The basic principles to be culled from the above references and other sources relating to the present invention are as follows: cesium beam frequency standards employ a Ramsey type microwave cavity to interrogate the cesium resonance; an oscillator is locked to that resonance to provide a working frequency, $\nu_o$; atomic frequency standards depend upon the existance of resonance phenomena in atomic systems; application of electromagnetic radiation at a specific frequency induces transitions between atomic energy levels; and, a method of probing this resonance is required that is capable of perturbing the atomic system as little as practicable while yielding maximum accuracy and stability for the frequency standard.

Asymmetries in the dimensions of the Ramsey cavity produce so-called cavity phase shifts which in turn produce a frequency error in the perceived atomic resonance, a frequency error which is dependent upon the level of microwave power in the cavity. As explained in the above cited reference a cavity phase shift $\phi$ produces a shift in the resonance of an atomic transition by approximately $\phi/T$ where T is the average transit time of the detected atoms through the device. This not only produces an error, which if $\phi$ were zero would be absent, but translates a power fluctuation into a frequency fluctuation. This is a result of the fact that T depends upon the power employed to interrogate the atoms. Some experiments have been conducted on a commercial cesium frequency standard and typical of most of these standards and consistent with the manufacturer's specification the frequency $\nu_o$ changes with temperature. For this particular unit the frequency change is $-1$ part in $10^{+13}$ per °C. Further experiments showed a near unity correlation coefficient between the frequency changes and the microwave power changes.

Understanding of the power stabilization concepts of the invention proceeds from an examination of the spectrum produced by an atomic beam interrogated in a Ramsey cavity. FIGS. 1a, 1b, and 1c illustrate such a spectrum for three different microwave powers.

As shown in FIG. 1a the spectrum consists of a central peak 11 with symmetric sidelobes 12 of decreased intensity. The central peak 11 serves as the precise reference to which the frequency standard oscillator is locked. As described above, the frequency of this central peak changes with the microwave power level of the signal used to interrogate the atomic beam. The sidelobes 12 also suffer a frequency shift associated with a power level shift but the physical mechanism of the sidelobe shift is such that the effect is much larger. The sidelobe frequency thus serves as a very sensitive indicator of microwave power level. This fact has been verified experimentally, and theoretically. The curves supporting these arguments are shown in the above cited references. For the commercial tube examined in these experiments, the offset ($\Delta \nu$) of the sidelobe frequency changed with respect to the central peak by approximately 4 parts in $10^{+10}$ for a 10% microwave power change. The perceived atomic reference frequency changed by $-3$ parts in $10^{+13}$. There is thereby gained almost a factor of 1000 in the ability to sense and to eliminate to a large degree frequency errors produced by microwave power changes.

The basic idea precipitating from the above is to construct a servo to control the microwave power by constraining the sidelobe 12 to a fixed offset frequency with respect to the central peak 11. This can be done straightforwardly to a resolution of 0.01 Hz in $\Delta \nu$ which can potentially improve the stability of cesium atomic clocks by more than 2 orders of magnitude as it is presently limited in commercial devices by microwave power instabilities and by any other mechanism which transduces in a way to cause a change in $\Delta \nu$.

Mechanization of the foregoing concepts of the invention can be realized using conventional components and circuits arranged as indicated in the block diagrams of FIGS. 2, 3 and 4. FIG. 2 is a generalized block diagram of the microwave power servo concept comprehended herein. It comprises atomic beam tube and detector 7, demodulator and frequency comparator circuit 8, frequency multiplier 9, locked oscillator 16 and attenuator 19. Execution of the concept requires interrogation of the central atomic peak and of the sidelobe. There are physical reasons why it may be disadvantageous to interrogate these two peaks simultaneously. Accordingly, a time-shared interrogation scheme is employed to allow long-term control of the oscillator by the central atomic peak with brief periods of sidelobe interrogation. The duration and rate of occurrence of these sidelobe interrogations are such as to preserve the short-and medium-term stability of the oscillator while allowing power corrections which would enhance the long-term stability of the device.

FIG. 3 shows a more detailed circuit arrangement and includes mixer 17, filter 18, programmable attenuator 19, switch 20, sidelobe integrator 21, main peak integrator 22, programmable synthesizer 23, controller 24 and buffer 25.

FIG. 4 shows circuits for phase lock of the systems Gunn oscillator to $n\nu_o + \nu'$ and includes Gunn oscillator 27, integrator 26 and mixers 28 and 29. Phase lock is achieved when the integrator 26 output is zero. In order for that to occur the two inputs to mixer 28 must be equal, that is; $\nu_{out} - n\nu_o = \nu'$. By adding $n\nu_o$ to both sides of the equation $\nu_{out} = n\nu_o + \nu'$ is obtained.

In operation, locked oscillator 16 is servoed to the center of atomic resonance reference and its frequency is chosen with consideration of the availability of precision oscillators and the needs of the user. The oscillator frequency is multiplied and offset, to attain atomic resonance frequency $\nu_1$. Many schemes are available to accomplish this including those depicted in FIGS. 3 and 4.

Programmable synthesizer 23 provides a frequency upon command from another device (system controller 24 for example) to; provide $\nu'$ to attain $\nu_1$, the main peak frequency $n\nu_o + \nu' = \nu_1$; provide $\nu''$ to attain $\nu_2$, the sidelobe frequency $n\nu_o + \nu'' = \nu_2$; and modulate $\nu'$ and $\nu''$ to permit phase sensitive demodulation of detected beam tube signal. As a practical matter there is no one superior modulation - demodulation scheme. Specific system requirements determine to a large extent which scheme is most advantageous. Several alternatives are: square wave vs sine wave modulation; frequency vs phase modulation; and digital vs analog demodulation.

A system atomic beam resonator is the source of a signal to which the frequency standard may be locked. Electromagnetic radiation is applied to a beam of atoms and transitions are induced between selected energy levels. When frequency of applied radiation is at center of atomic resonance, transition probability is a maximum and the detected signal may be processed in such a fashion as to indicate this maximum. Locked oscillator 16 is locked to this atomic transition.

Having reference to demodulator 14, frequency or phase modulation (of the applied radiation) about the center of resonance produces no detected signal component at the modulation frequency. Phase sensitive demodulation in demodulator 14 of the detected signal yields a voltage whose sign and magnitude indicate the deviation of the applied radiation frequency from the center of the resonance feature. This voltage may be used to steer the slave oscillator 16 (or programmable attenuator 19) and thus maintain the frequency (or applied power) constant.

Integrators 21 and 22 are standard components of a servo loop. They serve to insure long term accuracy and stability of the lock loop.

Switch 20 directs demodulator 14 output to the appropriate integrator; to the main integrator while main peak is interrogated at $\nu_1$ and to the sidelobe integrator while the sidelobe is interrogated at $\nu_2$. The integrator inputs are zeroed while idling, i.e. when the sidelobe is interrogated, the main peak integrator input is held at zero and vice versa. This insures that each integrator holds its most current value until new information is available to it. It is also necessary to zero both integrator inputs during switching functions to avoid signal contamination by transients. The system controller commands the switch.

Controller 24 performs modulation and switching command functions and provides interface to user for selection of modulation frequency, duty cycle, and desired sidelobe frequency. Optimum values of these parameters may vary with specific applications or with environmental conditions.

The system controller 24 can be any commercially available computer or processor capable of being programmed to perform the system tasks described and as required by the frequency standard. Such devices tyically have internal clocks and can time share various operations such as interrogating the sidelobe or interrogating the central peak as described above. By way of example, the controller may initiate the following sequence of events. The controller, monitoring its clock in accordance with its programmed commands initiates a sequence of events which serve to verify correct microwave power level and allow for power level corrections as necessary. The sequence involves disabling the main peak integrator 22 by zeroing or switching off its input via switch 20. The synthesizer 23 is programmed by the controller 24 to provide an interrogating signal at the frequency at which the sidelobe is to be constrained by the sidelobe integrator 21. The switch 20 is commanded by the controller 24 to direct the demodulator 14 output to the sidelobe integrator 21. At the end of the sidelobe interrogation the input to the sidelobe integrator 21 is zeroed by the switch 20 and the synthesizer 23 is reprogrammed to provide an interrogating signal at the frequency of the main peak and the demodulator output is directed to the main peak integrator 22. This sequence of actions constitutes time-shared interrogation of the sidelobe and of the central peak. The frequency of the sidelobe with respect to the main peak need not be measured per se. The sidelobe is constrained to remain a fixed frequency away from the main peak by its integrator and by the programmed settings of the synthesizer. Demodulator 14 is a device that serves to extract amplitude and phase information from a modulated signal. Such devices are routinely used in all present day frequency standards. They are commercially available in a variety of levels of sophistication. Generally they are phase sensitive demodulators and are commonly called lock-ins. A typical example is the model 840 AUTOLOC lock-in amplifier produced and sold by Keithly Corporation.

Filter 18 serves to remove unwanted signals provided by the mixing action of $n_{\nu o}$ with $\nu'$.

While the invention has been described in its preferred embodiment it is understood that the words which have been used are words of description rather than words of limitation and that changes within the purview of the appended claims may be made without departing from the spirit and scope of the invention in its broader aspects.

What is claimed is:

1. The method of reducing frequency error in an atomic clock having an atomic beam frequency spectrum with a central atomic peak and symmetric sidelobes comprising the steps of monitoring the frequencies of the central atomic peak and a sidelobe peak of the clock frequency spectrum, and varying applied clock microwave power to maintain a substantially fixed frequency difference between the central atomic peak frequency and the sidelobe peak frequency.

2. The method of reducing frequency error in an atomic clock as defined in claim 1 wherein the frequencies of the central atomic peak and the sidelobe peak are monitored on a time sharing basis.

3. In a cesium beam frequency standard having an atomic beam tube and microwave power source that generates an atomic beam frequency spectrum with a central atomic peak and symmetric sidelobes and in which a frequency standard oscillator is normally locked to the central atomic peak frequency of said spectrum, the improvement residing in a microwave power source control circuit said microwave power source control circuit comprising microwave power source control means;

interrogating means for detecting and monitoring the frequencies of the central atomic peak and a sidelobe peak of the atomic beam frequency spectrum, and comparator means responsive to said interrogating means for comparing the central atomic peak frequency and the sidelobe peak frequency and for generating a feedback control signal in response to frequency differences therebetween that substantially deviate from a fixed difference frequency, said feedback control signal being connected to actuate said microwave power source control means.

4. The microwave power source control circuit defined in claim 3 wherein said interrogating means monitors said central atomic peak and sidelobe frequencies on a time sharing basis.

5. The microwave power source control circuit defined in claim 4 including means for disengaging said frequency standard oscillator from said locked condition during period of sidelobe peak frequency monitoring.

* * * * *